(12) United States Patent
Xu et al.

(10) Patent No.: US 7,012,270 B2
(45) Date of Patent: Mar. 14, 2006

(54) PHOTOLITHOGRAPHY SYSTEM HAVING MULTIPLE ADJUSTABLE LIGHT SOURCES

(75) Inventors: Duanyi Xu, Beijing (CN); Guosheng Qi, Beijing (CN); Peijun Jiang, Beijing (CN); Xiaodong Fan, Beijing (CN); Kun Qian, Beijing (CN)

(73) Assignee: Tsinghua University, Bejing (CN)

( * ) Notice: Subject to any disclaimer, the term of this patent is extended or adjusted under 35 U.S.C. 154(b) by 41 days.

(21) Appl. No.: 10/389,043

(22) Filed: Mar. 14, 2003

(65) Prior Publication Data

US 2003/0201399 A1    Oct. 30, 2003

(30) Foreign Application Priority Data

| Mar. 15, 2002 | (CN) | ................. 02104178 A |
| Mar. 22, 2002 | (CN) | ................. 02116309 A |
| Apr. 15, 2002 | (CN) | ................. 02116681 A |
| Apr. 19, 2002 | (CN) | ................. 02117420 A |

(51) Int. Cl.
    *G01N 21/86* (2006.01)
(52) U.S. Cl. ..................................... 250/548
(58) Field of Classification Search ............... 250/234, 250/548; 355/53
    See application file for complete search history.

(56) References Cited

U.S. PATENT DOCUMENTS

| 5,343,271 A | * | 8/1994 | Morishige .................... 355/53 |
| 5,581,075 A | * | 12/1996 | Naraki et al. ................ 250/205 |
| 6,002,466 A | * | 12/1999 | Brauch et al. ................ 355/53 |
| 6,233,039 B1 | * | 5/2001 | Yen et al. ..................... 355/53 |
| 6,536,966 B1 | | 3/2003 | Butler |

OTHER PUBLICATIONS

P.F. Carcia et al., Thin Film for Phase-shift Masks, Vacuum and Thim Film, HIS Publishing Group, Sep. 14-21, 1999.

* cited by examiner

*Primary Examiner*—Thanh X. Luu
(74) *Attorney, Agent, or Firm*—RatnerPrestia

(57) ABSTRACT

The invention relates to a device for photolithography of integrated circuits, at least comprising base plate, precision working table, optical head array; the optical head array adopts a line-array photosource scan-imaging device to realize the optical probe technique, and the line-array photosource scan-imaging device comprises a line-array photosource consisting of a plurality of adjacent linearly-arranged micro-photosources and the micro-imaging system performing micro-imaging for the photosource; the line-array photosource can realized not only with a plurality of microlasers but also with a line-array photosource device; a novel method is disclosed that can perform encoding based upon the line-array photosource scan width; an integrated circuit photolithographic method which can align the silicon wafer not only at the beginning of photolithography but also can repeatedly align it if needed during the photolithographic process.

6 Claims, 8 Drawing Sheets

PHOTOLITHOGRAPHY SYSTEM HAVING MULTIPLE ADJUSTABLE LIGHT SOURCES

FIELD OF THE INVENTION

The present invention relates to a microengineering technical field, and more particularly, to a device and a method for photolithography of integrated circuits.

BACKGROUND OF THE INVENTION

At present, engineering for manufacturing integrated circuits employs a projection photolithography system. FIG. 1 is a schematic block diagram of the projection photolithography system. As shown, the light emitted from a light source 1 is converged to a mask plate 3 by a convergent lens. The image on the mask passes through a set of lenses 4, 5 and forms a reduced image on a silicon wafer 6, thus, a target pattern is obtained by means of photolithography. Since the projection photolithography system performs projection imaging by isomg a mask for the pattern of a whole chip, a large viewing field is needed, which restricts the resolution of the image. Further, with the existing projection photolithography, the wavelength of an incident light has been reduced to 260 nm, the numerical aperture (NA) of a lens has reached 0.8, and the minimum line-width of a circuit has reached 0.18 μm, all of which have approached to the physical limits. Therefore, the potential for increasing the minimum line-width is limited.

Additionally, with the above projection scheme, for each set of circuits, one set of masks is prepared, thus, it is bound to increase the production cost. Especially for small batch production, the cost of each chip enormously rises.

SUMMARY OF THE INVENTION

It is an object of the present invention to provide a device and a method for photolithography of integrated circuits. With the device and method, an optical-head array replaces single optical head so that a plurality of chips are simultaneously photolithographed to enhance production efficiency.

Another object of the invention is to provide a line-array photosource scan-imaging device for the optical-head array in the integrated circuit photolithography device. In the scan-imaging device, the techniques of small viewing field, short wavelength and near-field are utilized for the line-array photosource to achieve an ultra-high resolution; the line-array photosource is modulated to achieve a width-scanning photolithography so as to improve efficiency.

Further, the object of the invention is to provide a print encoding method for the line-array photosource scan-imaging device of the optical-head array. In the method, the print information of a chip can be encoded according to the scan width of the line-array photosource, thus, the lithographic technique is simplified and the reliance on the mask in the projection photolithography is cast off.

To attain one of the above objects, the invention discloses a device for scanning-photolithography of integrated circuits, at least comprising:
base plate, being at the bottom of the photolithography device and used for supporting the whole scanning-photolithography device;
precision working table, placed on the upper surface of the base plate and used for supporting a silicon wafer on which a pattern of an integrated circuit is to be lithographed; and
optical-head array, placed above the precision working table and used for photolithographing a pattern of chips on the silicon wafer, possessing a plurality of optical heads arranged in the manner of matrix and the space in X- or Y-direction of the matrix can be adjusted according to the size of the integrated circuit chip to be lithographed by means of a computer.

To attain another one of above objects, the invention discloses a method for scanning-photolithography of integrated circuits, comprising the following steps:
S1: reading the encoding information of an integrated circuit pattern by means of a computer;
S2: adjusting and fixing the distances between the optical heads of the optical-head array by the computer;
S3: placing and roughly positioning a sensitized silicon wafer coated with photoresist on the precision working table, removing the working table into the machining range;
S4: respectively auto-focusing each optical head of the optical-head array onto the surface of the silicon wafer;
S5: synchronously adjusting and controlling the photo-source's on-off state of each optical head of the optical-head array according to the encoding information of the circuit pattern by a computer to form a photolithographic pattern, after reducing the pattern by the micro-imaging system, simultaneously accomplishing the direct-writing photolithography for all integrated circuit chips on the same silicon wafer;
S6: removing the working table out of the machining range and taking out the silicon wafer; and
S7: performing the processes of etching, ion implantation, diffusing, etc., for the photolithographed silicon wafer, accomplishing the fixation of the sensitized pattern.

To attain another one of above objects, the invention discloses a line-array photosource scan-imaging device used for the optical-head array in the integrated circuit photolithography device, comprising:
line-array photosource, consisting of a plurality of adjacent, linearly arranged, short-wavelength micro-photosources, the on-off switch of each of which can be controlled independently; and micro-imaging system, demagnifying the image of said line-array photosource.

To attain one of above objects, the invention discloses a method for encoding a pattern of chips, comprising the following steps:
detecting the scan width of the line-array photosource and the number of rows of the chip pattern's pixels, assuming the scan width being p and the number of the pixel's rows being m;
according to the serial numbers, equally dividing all rows of the chip pattern into m/p groups, p rows per group;
encoding for data of p rows in each group;
setting up the group index for each group's encoding information; and
saving the encoding information and group index of each group.

BRIEF DESCRIPTION OF THE DRAWINGS

FIG. 12 is a block diagram of pixel groups with a scan width of 4;

DETAILED DESCRIPTION OF THE INVENTION

For a more complete understanding of the present invention, reference is now made to the following descriptions of preferred embodiments given in conjunction with the accompanying drawings.

Figure 1:
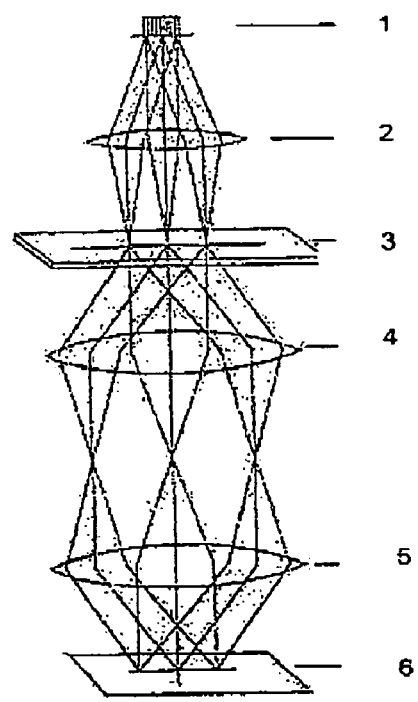
FIG. 1 is a schematic block diagram of the projection photolithography.
Figure 2:
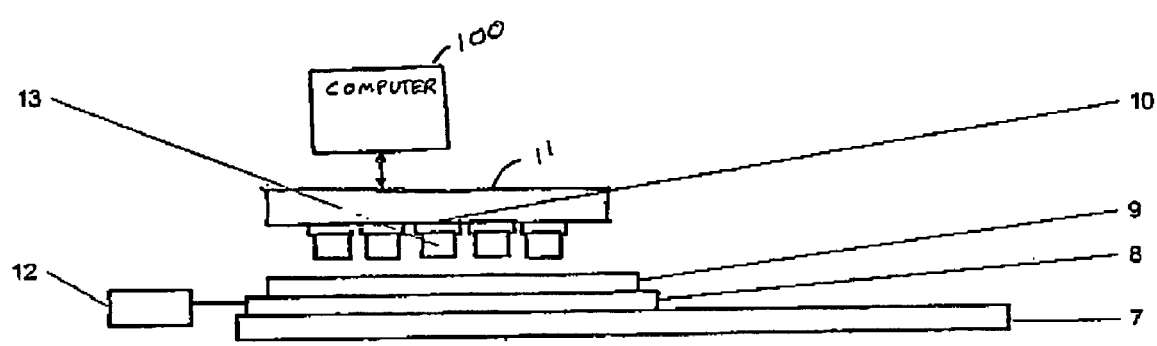
FIG. 2 is a schematic block diagram of a device for manufacturing integrated circuits utilizing array-style optical heads and direct-writing photolithography.

FIG. 2 is a schematic block diagram of the present invention's integrated circuit scanning-photolithography device, wherein, 7—base plate, 8—precision working table, 9—silicon wafer, 10—calibrating optical-head, 11—optical-head array, 12—precision servomotor, 13—alignment calibrating optical-head reading device.

A base plate 7 is at the bottom of the device and is used to support the whole integrated circuit manufacturing device.

A precision working table 8 is placed on the base plate 7 and used to position a silicon wafer 9 to be photolithographed. Employing an air-floating device, it can move reciprocating in X-direction at a high speed under the control of a precision servomotor 12, and the precision is managed by a laser interferometer. Meanwhile, it can finely step in Y-direction, and the precision is managed by piezo-electric ceramic. It can also move in Y-direction out of the working range, and perform the loading/unloading of silicon wafers.

An optical-head array 11 consists of m×n optical heads arranged in a m×n matrix, whose spaces of both X-direction and Y-direction can be regulated via computer 100 if needed, and the regulation value is determined based upon the size of the integrated circuit chip to be lithographed. Each of m×n optical heads includes an identical optical-probe array having a plurality of identical optical probes arranged in a matrix.

FIG. 2 is a side view of the photolithography device showing either the top end or the bottom end of the optical head array 11. Each of the top and bottom ends of the optical-head array 11 has a calibrating optical-head 10 used for precisely aligning the m×n optical heads. The calibrating optical heads 10 have the capability of reading and writing as well, and during the process of lithographing the circuit pattern, they move in the same way and have the same on-off state as the other optical heads. They can accomplish precise alignment based on the information of the positioning and calibrating lithographed onto the silicon wafer which is read by the calibration optical-head reading device 13, ensuring the position matching of the same silicon wafer during each lithographic process. In the whole optical-head array 11, the other heads except the above two calibrating optical-heads 10 are all lithographic optical heads, just possessing the capability of lithographing silicon wafers.

Each lithographic optical-head of the optical-head array 11 is responsible for lithographing one chip pattern, thus, it is possible to photolithograph all the chip patterns on the whole silicon wafer with one exposure.

Optical head employs optical probe technique, and reduces the light-spot's minimum size and photolithographic-line width by means of near-field effect, to realize an ultra-high resolution. A single optical-probe array is a line-array photosource consisting of a plurality of micro-photosources so that the size of light-spots can be adapted to the requirements of variable scan line width, thus, greatly increasing the photolithography efficiency. Such optical probe technique can be realized with a line-array photosource scan-imaging device. The line-array photosource scan-imaging device comprises of:

line-array photosource, consisted of n adjacent linearly-arranged short-wavelength micro-photosources, the on-off switch of each of which can be controlled independently;

the number n of the micro-photosources and the wavelength can be determined based on specific requirements;

micro-imaging system can employ various kinds of imaging devices to realize small viewing field and near-field technique for the line-array photosource.

Figure 3:
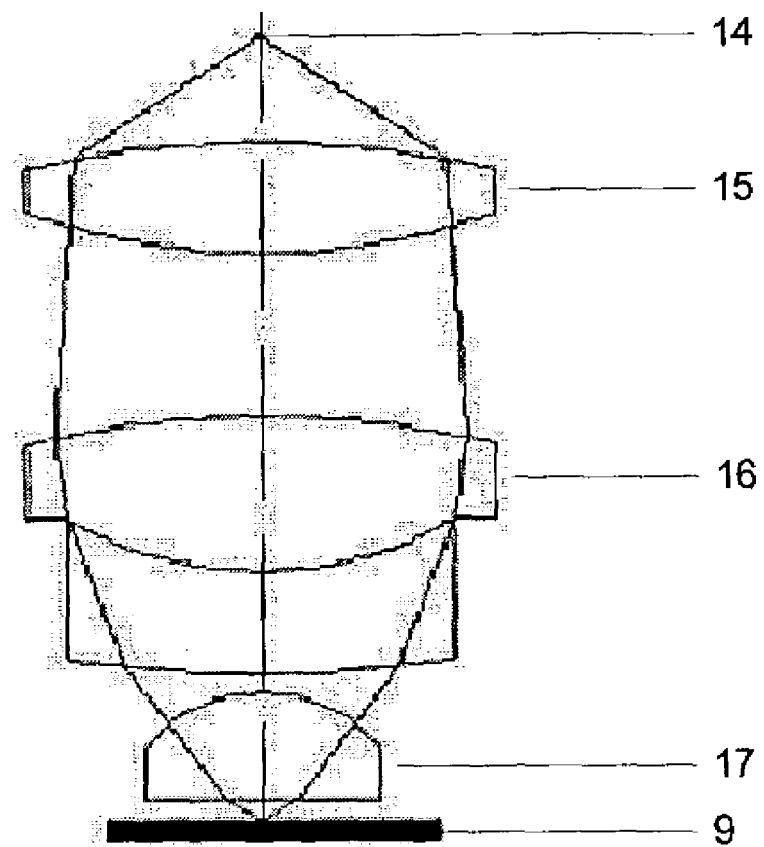
FIG. 3 is a block diagram of scan-imaging device utilizing lens-imaging system as a micro imaging system.

FIG. 3 is a diagram of a scan-imaging device utilizing lens imaging system as a micro-imaging system, wherein comprising: line-array photosource 14, convergent lens 15, lens 16, solid immersion lens (SIL) 17, and silicon wafer 9 to be processed.

As shown in FIG. 3, a line-array photosource 14 passes through a convergent lens 15, a lens 16 and a solid immersion lens (SIL) 17, and forms reduced real image on the silicon wafer with the shape all the same as the image of the line-array photosource. If in the line-array photosource, the size of single micro photosource is 20 $\mu$m, the length of the line-array is 2 mm, then for imaging system, the size of object field is just 2 mm. On the condition of small viewing field and under ideal circumstances (e.g. 260 nm photosource and solid immersion lens with a numeric phase-shift aperture of 1.2), the diameter of the image formed by single micro photosource is less than 0.1 $\mu$m, namely the minimum photolithographic-line width can reach 0.1 $\mu$m or even much less.

Figure 4:
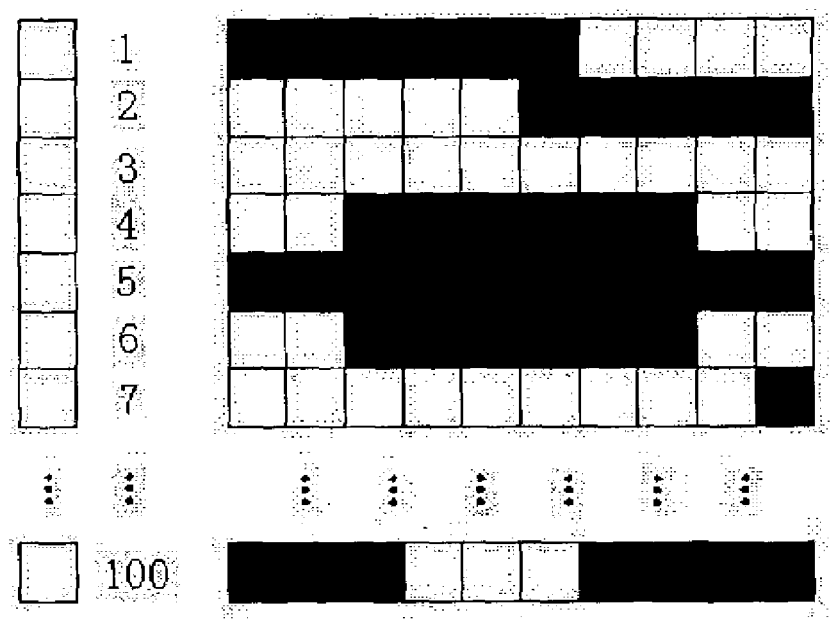
FIG. 4 is a schematic diagram of the shape and scanning principle of a line-array photosource.

The line-array photosource can be realized by a plurality of micro lasers. FIG. 4 is a diagram of the shape and scan-imaging principle of the line-array photosource realized by micro lasers. As shown in the left line of FIG. 4, 1, 2, 3, - - - , 100 respectively represent 100 completely identical micro lasers, all of which constitute a linear photosource array. In the linear photosource array, lasers are independent to each other; the on-off switch of each laser can be controlled independently. Thus, through managing each laser's on-off switch in the line-array photosource, the shape of the image of the line-array photosource can be controlled.

By means of adjusting the line-array photosource, it is possible to realize width scanning, namely, all patterns on the silicon wafer in given width can be simultaneously photolithographed in one scanning process. The principle of the photolithographic imaging of the width scanning is shown in FIG. 4. The right part of FIG. 4 consists of a plurality of lines of patterns, form up to down, each line are patterns (white block represents the place where material is not sensitized, and black block represents that being sensitized) photolithographed in one scanning process, which are respectively imaged for every corresponding photosource of the line-array photosource. A plurality of lines of such patterns are arranged together to form the target pattern as shown. Obviously, when the photolithographic resolution is 0.2 μm, it is possible to complete the photolithographic machining in the width range of 20 μm within one scanning of the line-array photosource. Compared with single photosource, the production efficiency increases by 100 times.

In an embodiment of the present invention's integrated circuit manufacturing device, optical head array is a 40×40 square matrix arranged with 1600 optical heads, adjustable range of the spaces of X-direction and Y-direction is 8–20 mm; single probe array is a line-array photosource constituted with 100 semiconductor lasers, all of the lasers employ blue light with wavelength of 407 nm as photosource, the scan-line's width is adjustable; the numeric phase-shift aperture of the imaging system's object lens is 0.95, the maximum diagram of lens is 2 mm, the photolithographic resolution is 0.2 μm; the outline size of precision working table is roughly 700 mm×400 mm, the moving precision is 0.02 μm, the moving speed when scanning is 1000 mm/s, only 10 minutes is needed to lithograph a circuit unit of 20 mm×20 mm, and also within 10 minutes, accomplishing photolithography of 1600 chips on the silicon wafer as well.

Figure 5:
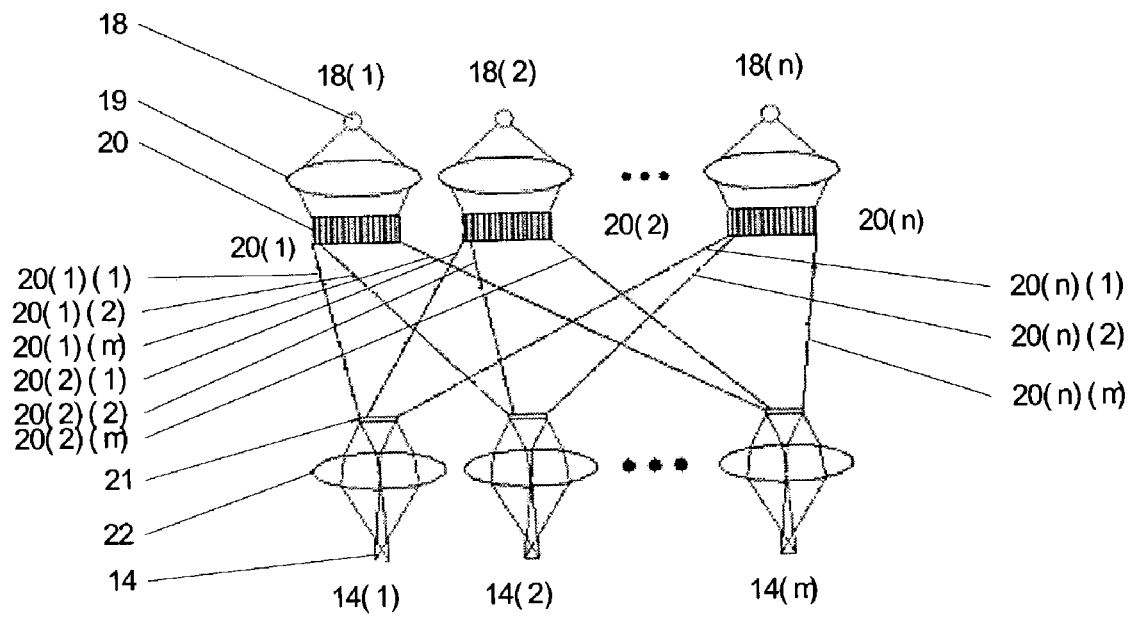
FIG. 5 is a schematic diagram of the line-array photo-source device.

Above line-array photosource can also be realized by the line-array photosource device shown in FIG. 5. As shown in FIG. 5, in the device, following elements successively arranged in a same line-array length:

n semiconductor lasers 18 emitting light with even intensity;

n convergent lenses 19 respectively converging the emergent light of the lasers;

n optical fiber beams 20 receiving the emergent light of the lens and each beam having m pieces of optical fiber; and m line-array optical fiber heads 21, each of which having
n pieces of optical fiber being straight-lined and respectively coming from individual optical fiber beam 20, and imaging lenses 22, each of the imaging lenses corresponding to each of the line-array optical fiber heads.

The line-array optical fiber head 21 successively consists of: optical-fiber array layer, being arranged with the optical fibers, each of which comes from each optical fiber beam; even light-intensity layer, made up of the mask and coating on the line-array optical fiber head; and phase-shift aperture layer where the area corresponding to the optical fiber appears as strict square and presents high transmissivity to the laser having a wavelength, while other areas present high absorbance.

As shown in FIG. 5, the semiconductor laser array 18 consists of n semiconductor lasers 18(1), 18(2), . . . , 18(n); the convergent lens array 19 consists of n convergent lens; the optical fiber beam array 20 consists of n optical fiber beams 20(1), 20(2), . . . , 20(n), wherein every optical fiber beam comprises m pieces of optical fiber, e.g. the optical fiber beam 20(1) comprises optical fibers 20(1)(1), 20(1)(2), . . . , 20(1)(m); the output beam of the device—line-array photosource (14) consists of photosources 14(1), 14(2), . . . , 14(m).

Optical fibers, each of which is respectively taken from individual optical fiber beam in the optical fiber beam array 20, are successively arranged to be a line array to constitute the line-array optical fiber head 21, then through imaging lens 22 the size is further reduced, becoming the line-array photosource 14 that conform to the requirements of the scanning device in the integrated circuit photolithography system. For example, the optical fibers 20(1)(1), 20(2)(1), . . . , 20(n)(1) are respectively from the optical fiber beams 20(1), 20(2), . . . , 20(n), consisting the line-array optical fiber head 21 with a length of n, then through the imaging lens 22 forms the image, namely, the line-array photosource 14(1). The length of every line-array photosource is determined by the number n of the lasers of the semiconductor laser array 18, the number of the line-array photosources is determined by the number m of the optical fibers of each optical fiber beam in the optical fiber beam array 20, wherein m and n may be determined according to the specific requirements.

The emergence angle of the beam emitted from the optical fiber core distributes randomly over the range of less than the total-reflection angle (the total-reflection angle is formed, when the laser emitting from a fiber material into a coating material). The imaging lens 22 reduces the size of micro photosource and at the same time can optimize the illumination angle of the micro photosouce if needed.

Semiconductor laser array 18 utilizes the feedback controlling and constant temperature controlling of the emitting-light intensity to attain the evenness of the emergent light intensity; meanwhile, the laser operates at a lower power to prolong its service life.

Figure 6:
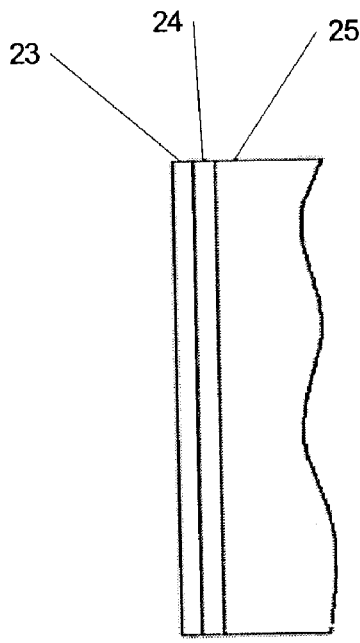
FIG. 6 is a front view of a line-array optical fiber head.

FIG. 6 is a front view of the line-array optical fiber head. As shown, 23 is a phase-shift aperture layer, 24 is a even light-intensity layer, 25 is an optical fiber array.

Figure 7:
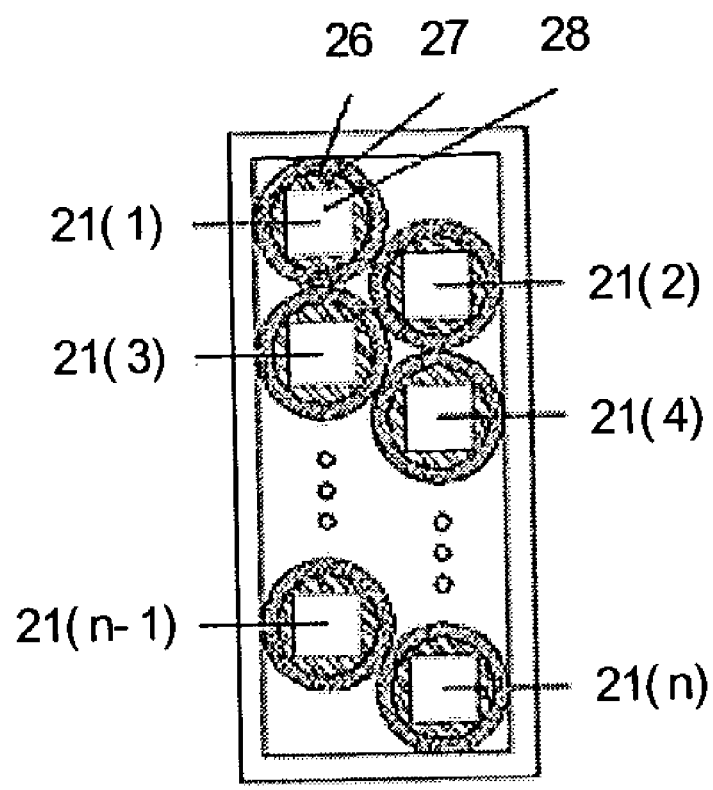
FIG. 7 is a left view of the line-array optical fiber head shown in FIG. 6.

FIG. 7 is a left view of the line-array optical fiber head shown in FIG. 6. As shown, 26 is an optical fiber coating layer, 27 is an optical fiber core, 28 is the phase opening on the phase-shift aperture layer corresponding to the fiber optical. Optical fibers 21(1), 21(2), . . . , 21(n) constitute the optical fiber array 25.

The even light-intensity layer 24 made up of negative photoresist plays a role as evening up the illumination light intensity. The output beam of the line-array optical fiber, i.e., the optical fiber array 25 is used to directly expose to the negative photoresist once, obtaining a mask having a exposure intensity consistent with the line-array optical fiber light intensity distribution; then the mask is processed, namely, the negative photoresist is developed, solidified to obtain a layer of mask so that the transmissivity of the area, on the mask, where the former exposure degree is less increases a little, otherwise decreases a little. The mask is coated on the line-array optical fiber head according to the position of exposure, which can even light intensity.

Figure 8:
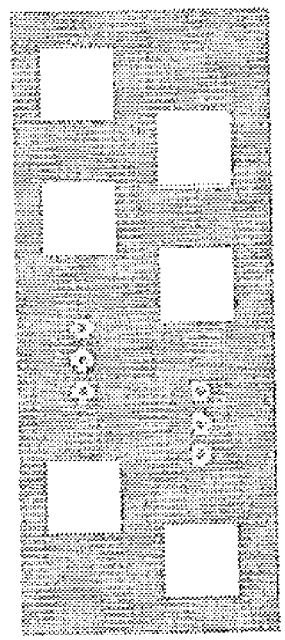
FIG. 8 is a schematic diagram of the phase-shift aperture layer shown in FIG. 6.

FIG. 8 is a schematic block diagram of the phase-shift aperture layer 23 shown in FIG. 6. As shown, the black area represents the place in which the material has a high absorbance for the laser, and white area (presenting as strict square) represents the place in which the material has a high transmissivity for the laser. Thus, the single photosource has a regular shape of a square. The phase-shift aperture layer can be attained by photolithographing common phase transformation materials.

Since each photosource in the line-array photosource 14 can be controlled to be lighting-up or off by means of controlling the on-off switch of the corresponding laser in the semiconductor laser array 18. Therefore, when the line-array photosource 14 is used in the integrated circuit photolithography system, for controlling the program and encoding, it is easy to separately control the light-spots with odd serial numbers and the light-spots with even serial numbers, so the line-array photosource can be equivalent to being on the same straight line.

In an embodiment of the device, a semiconductor laser adopts blue laser having a wavelength of 405 nm, the number of the lasers n=100, the number of the optical fiber of per optical fiber beam m=100, the phase-shift aperture of the optical fiber and the convergent lens 22 are both 0.1, the diameter of the optical fiber core 27 is 40 μm, the diameter of the coating layer 26 is 55 μm, the opening 28 on the phase-shift aperture layer 23 is a 30 μm×30 μm square, the enlargement ratio of the imaging lens 22 is ⅔. Thus, the device can simultaneously provide 100 line-array photosources with even illumination and synchro-control. Each line-array photosource is a line array consisting of 100×1 square micro photosources, the size of single micro photosouce is 20 μm×20 μm, and the total length of the line-array photosource is 2 mm.

The following relates to a novel method for encoding chip patterns, the fundamental idea of that method is:

first, detecting the scan width of line-array photosource, assuming being p, that is, the scan device utilizes p×1 line-array photosource;

then, for a two-color (white-black) pattern having size of m×n pixels (i.e. an m×n matrix, wherein each element's size is 0 or 1), equally dividing all of data rows according to the serial numbers into m/p groups, p rows per group;

for data of p rows in one group, encoding column-by-column;

setting up the group index for the encoding information of the each group;

finally, saving obtained encoding information and group index.

In the method, pattern encoding adopts group-by-group binary encoding. The width of group is the scan width of the scanning device, thus, when the control system reads encoding, it is convenient to read pattern data according to the scan width.

The method will become more apparent from the following description in conjunction with the accompanying drawings.

Figures 9, 10, 11:
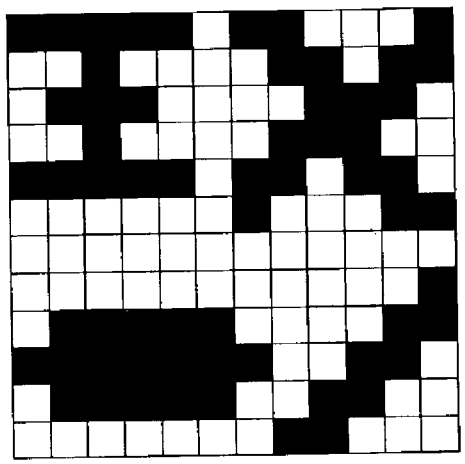
FIG. 9 is a 12×12 pattern of a chip.
FIG. 10 is the pixel code corresponding to the pattern shown in FIG. 9.
FIG. 11 is a block diagram of pixel groups with a scan width of 3.

FIG. 9 is a pattern of a 12×12 chip, wherein, each small block is a pixel of the pattern, a black block presents the pixel being an exposure area, a white block represents the pixel is a non-exposure area.

FIG. 10 is a diagram of the binary codes of the pixels corresponding to the chip's pattern shown in FIG. 9, wherein, code 1 represents the pixel being an exposure area, and code 0 represents the pixel being a non-exposure area.

Figure 17:
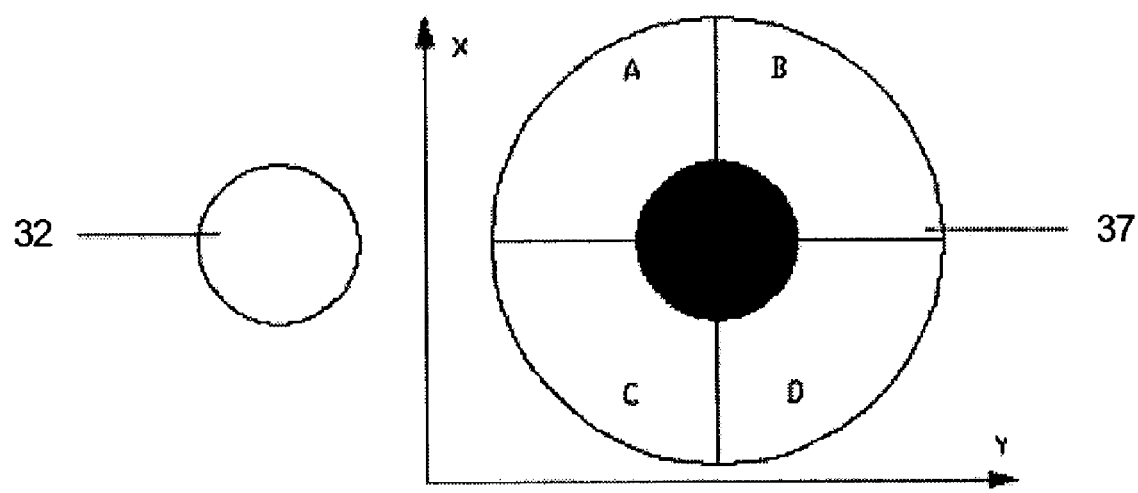
FIG. 17 is a schematic diagram of the calibrating sub-pattern and its image under a four-quadrant photodetector.

FIG. 11 is a block diagram of pixel groups with a scan width of 3; FIG. 12 is a block diagram of pixel groups with a scan width of 4; FIG. 17 is the encoding order of the first group of data shown in FIG. 15.

For the chip's pattern shown in FIG. 9 and FIG. 10, if the scan width of the photolithographic process is 3, 12 rows of data can be divided into 4 groups: the data of rows 1, 2 and 3 being the first group, those of 4, 5 and 6 being the second group, and so forth. FIG. 11 illustrates the state of pixel grouping with a scan width of 3.

Figure 13:
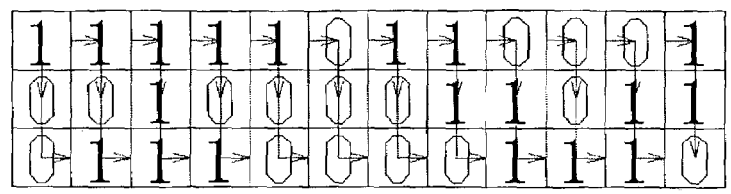
FIG. 13 is the encoding order of the first group data shown in FIG. 11.

Column-by-column encoding mode is adopted to encode each group of data obtained by dividing groups. FIG. 13 illustrates the encoding order of the first group data shown in FIG. 11. According to the order indicated by arrows in FIG. 13, the binary codes of the group is attained: 10010111, 11011000, 00100110, 01100101, 1110 (hexadecimal code is 97D82665E).

Similarly, the codes of the second, third and fourth group are as follows:

Second group: 01001011,00100100,00011110,10011001, 1001 (4B241E999);

Third group: 00000100,10010010,01000000,00000000, 1011 (04924000B); and

Fourth group: 10011011,01101101,10100001,01111010, 0000 (9B6D17A0);

Thus, the data codes of the pattern are 97D82665E, 4B241E999, 04924000B, 9B6D17A0.

For chip's pattern shown in FIG. 9 and FIG. 10, if the scan width is 4, 12 rows of data can be divided into 3 groups. FIG. 12 illustrates the state of pixel grouping with a scan width of 4.

The binary codes of each group are as follows:

First: 10001010,11111010,10000000,10001101,01110011,011 01100 (8AFA808D736C);

Second: 10001000,10001000,10000000,11001000,00001000,1100 0101 (888880C808C5);

Third: 01001110,11101110,11101110,01000001,00110110,1100 1000 (4EEEEE4136C8).

Thus, the data codes of the pattern are 8AFA808D736C, 888880C808C5, 4EEEEE4136C8.

For a chip's pattern, a 10 mm×10 mm chip's pattern, if its minimum line width is 100 nm, the number of the pixels of the pattern will be 1010! The array-style integrated circuit photolithography system adopts a width scanning mode, requiring rapidly reading each group data in the pattern, so it is necessary to add group index in the encoding file.

Group index is a string of data which records the start address of the codes in files corresponding to data of each group. The length of data in an index of a single group is 32 bytes so as to access some group of data more directly and rapidly.

An integrated circuit manufacturing method is shown in FIG. 2 comprising following steps:

1. Performing the signal processing for the pattern of an original integrated circuit within a computer, i.e. the chip's pattern encoding, in order to executive a machining controlling according to pattern encoding information by a computer;

2. Constituting a optical head array 11 with m×n optical heads, controlling and adjusting spaces between the optical heads by a computer according to the size of circuit pattern to be lithographed so that the optical head array 11 coats the whole silicon wafer to be processed, adjusting and fixing it in a place to form a machining space;

3. Placing a sensitized silicon wafer coated with photoresist on the precision working table 8, and roughly positioning the wafer, then removing working table into machining space;

4. Scanning the wafer alone with the calibrating optical head 10 of the optical head array 11, making the signal for recording the information of the silicon wafer, the signal used for aligning and correcting of the wafer during the process of register-lithography;

5. Respectively auto-focusing each optical probe array 111–1 mn of the optical head array 11 to the surface of the silicon wafer;

6. Starting photolithographing the chip, having the precision working table 8 reciprocating moving in a direction (assuming X-direction), and precisely stepping along its perpendicular direction (assuming Y-direction). In the photolithographic process, each probe array photosource's on-off state of the optical head array 11 is synchronously adjusted and controlled with a computer according to the encoding information of the integrated circuit pattern, to perform repetitious lithography of a plurality of integrated circuit chips on a same silicon wafer;

7. Removing the working table out of the working space to take out the silicon wafer;

8. Performing diffusion, blending, etc., for the photolithographed silicon wafer, accomplishing the fixation of the sensitized pattern, washing out the original photoresist, coating new photoresist onto the silicon wafer again;

9. Performing the second register-lithography for the silicon wafer, firstly, aligning the sensitized silicon wafer with said two alignment calibrating optical-heads 10 so as to match it with the preceding machining position, once precisely aligned, performing steps 5–8's operation; and 10. Repeating the step 9 to perform repetitious register-lithography, diffusing and blending, thus, completing the production of a plurality of integrated circuits.

For the integrated circuit photolithography device, in order to locate rapidly and precisely, and perform synchronous, real-time correcting of the circuit pattern during the process of register-lithography, above integrated circuit manufacturing method employs an lithography optical head calibrating method and the fundamental principles are as follows:

1. first register-lithography:
    (1) Determining A key dots of the pattern according to the precision of the circuit pattern's register-lithography;
    (2) Arranging the circuit pattern as a N×M matrix, encoding the distinguishing features of the circuit pattern and lithographing it to the positioning base encoding information band on the silicon wafer;
    (3) Setting up a pair of calibrating patterns at the center of the rectangle's top side and bottom side constituted of circuit pattern, the calibrating pattern is positioned at a pair of circuit pattern and consists of A calibrating sub-patterns with the same number as the number of above said key dots;
    (4) Starting register-lithography, wherein, for each key dot of the circuit pattern encountered, lithographing a pair of corresponding calibrating sub-pattern on the silicon wafer for alignment.

2. second register-lithography:
    (1) Calibrating the silicon wafer according to the distinguishing features of circuit pattern recorded in the positioning base encoding information band;
    (2) Starting register-lithography, when getting to the pattern's key dots, reading the coordinates of corresponding calibrating sub-pattern on the silicon wafer, and comparing the coordinate of the key dot with that of the calibrating sub-pattern. If both coordinates coincide with each other, continuing the register-lithography; otherwise, differentiating error, when it is a temperature error, adopting even processing, when it is random error, continuing the register-lithography on the position of the calibrating sub-pattern and refreshing recorded coordinate data.

3. repeating step 2 to perform register-lithography a plurality of times, until fulfilling the whole circuit pattern's lithography.

Figure 14:
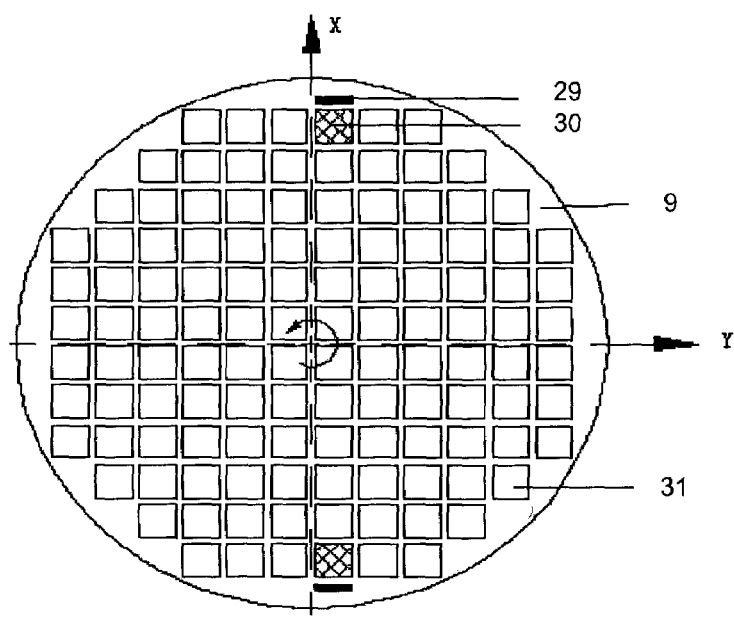
FIG. 14 is a block diagram of photolithography on a silicon wafer by the optical-head array of the device shown in FIG. 2.

The positioning base encoding information band, the circuit pattern and the calibrating pattern mentioned above are shown as FIG. 14, wherein, 9—silicon wafer, 29—positioning base encoding information band, 30—calibrating pattern, 31—circuit pattern.

Figure 15:
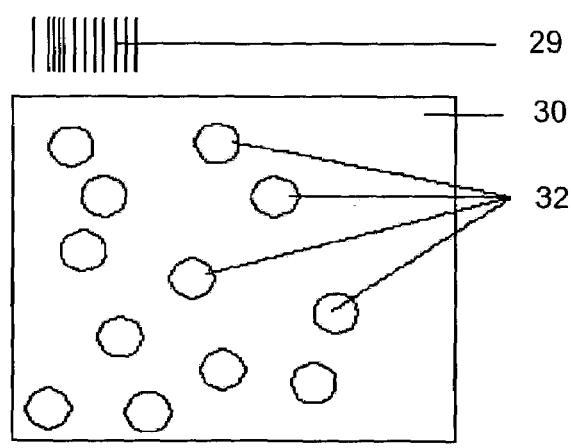
FIG. 15 is a block diagram of the amplifying view of a calibrating pattern.

Relationship between the calibrating pattern and the calibrating sub-pattern is shown as FIG. 15, the amplifying diagram of the calibrating pattern, wherein, 32 is the calibrating sub-pattern.

Figure 16:
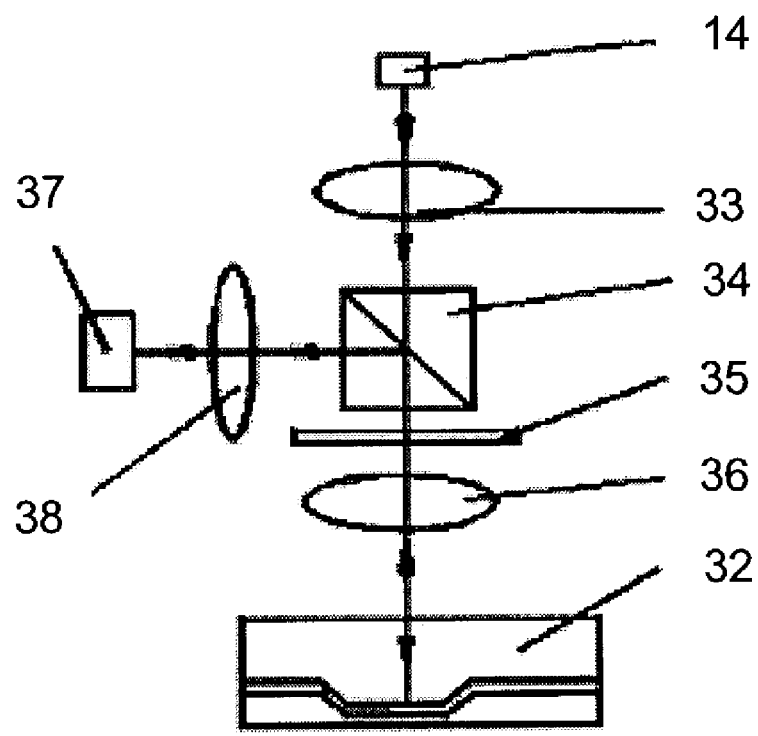
FIG. 16 is a block diagram of the reading device of the calibrating optical-head.

When calibrating with the calibrating method, it is necessary to use a calibrating optical head reading device to read calibrating sub-pattern. The reading device is shown as FIG. 16, wherein, 14—photosource, 33—diffusion lens, 34—polarizing spectroscope, 35—quarter wave plate, 36—focusing lens, 37—photodetector, 38—focusing lens. The reading device employs astigmatism method for focusing, employs astigmatic elements to convert the change of the object lens' out-of-focus value into the change of the energy of lights in various directions, and after detecting with photodetector 37, obtaining error signals.

FIG. 17 is a schematic diagram of the calibrating sub-pattern and its image under a four-quadrant photodetector.

The principle of photodetector 37 is: the calibrating optical head positioned in positive X-direction adopts a four-quadrant photodetector, when (A+B) is in pattern-equilibrium with (C+D), it shows that X-direction being calibrated; when (A+C) is in pattern-equilibrium with (B+D), it shows Y-direction being calibrated. The calibrating optical head positioned in negative X-direction also adopts the four-quadrant photodetector, when (A+C) is in pattern-equilibrium with (B+D), it shows Rz-direction being calibrated, at this time the pair of the calibration patterns have fulfilled calibrating.

Following in conjunction with the drawings describes the calibrating method:

1. first lithography:
    (1) Determining a key dot of a pattern according to the precision of the circuit pattern's register-lithography;
    (2) Loading a silicon wafer on the card-loading place right of the working table 8, and pre-positioning by a pre-position device;
    (3) Removing working table into the left lithography place;
    (4) Adjusting the space between two calibrating optical heads 10, so as to the lithography place of said heads being on the edge of the silicon wafer to adapt the to silicon wafers of various sizes;
    (5) Encoding the positioning base of the silicon wafer, the information of the silicon wafer, pattern information, etc., and writing said encoding to the positioning base encoding information band 29 beside the calibrating pattern 30;
    (6) Lithographing the first pair of calibrating sub-patterns in the calibrating pattern 30 by two calibrating optical heads 10 with ample power;
    (7) Starting lithographing the circuit pattern, wherein, for each encountered key dot, correspondently lithographing a pair of calibrating sub-patterns in the calibrating pattern 30 on the silicon wafer by two calibrating optical head 10.

2. second lithography:
    (1) Performing pre-aligning for the silicon wafer on the working table 8 by the pre-aligning device at the card-loading place;
    (2) Removing the working table 8 to the lithography place;
    (3) Through slightly adjusting the working table 8 in X- and Y-direction, finding the positioning base encoding information band 29, and to avoid damaging the calibrating pattern 30, the calibrating optical head reading device reads with weak power (one fiftieth–one hundredth of writing power) the positioning base, the information of the silicon wafer and the information of the pattern; meanwhile, finding the first pair of calibrating sub-patterns on the calibrating pattern 30, then according to the deviation information obtained from measuring the first pair of calibrating sub-patterns by photodetector 37 and said other information, synchronously adjusting the working table 8 in X-Y-Rz directions to fulfill the aligning operation;

(4) Starting lithographing the chip, wherein, once encountering a key dot of the circuit pattern, performing calibrating again according to the coordinates relationship between the key dot and corresponding calibrating sub-pattern. When calibrating (alignment) again, detecting with the photodetector 57 to attain an error signal. If the signal is not negligible, though processing by a computer, adjusting the relative position between optical head array 11 and the silicon wafer to complement the error;

3. Repeating step 2 to perform register-lithography a plurality of times, until fulfilling lithography for the whole circuit pattern.

The key of this calibrating method lies in tightly jointing calibrating with computer-processing. There are a plurality of calibrating sub-patterns in a pair of calibrating patterns, the number of calibrating sub-patterns is related to the circuit pattern, during one lithography, there can be calibrating a plurality of times, which can extremely increase the precision of calibrating.

Advantageous Effects

As seen from above, the device for photolithographing integrated circuits disclosed in present invention utilizes optical head array to direct-photolithograph. It is possible to simultaneously fulfill photolithography of a plurality of chips, greatly increasing the photolithography efficiency.

Each optical head employs a line-array photosource, by means of small viewing field, short wavelength and near-field technique, realizing an ultra-high resolution and greatly decreasing photolithographic line width, and realizing width scan photolithography and increasing photolithography efficiency as well.

By adopting the novel pattern encoding method, the lithographic technique is simplified and the reliance on the mask in the projection photolithography is cast off.

The integrated circuit photolithographic method employs the calibrating optical head so that in the process of photolithography, a plurality of calibrations can be performed if needed to increase the precision of photolithography.

The invention claimed is:

1. A scanning photolithography device for scanning-photolithography of integrated circuits, at least comprising:
    a base plate, being at a bottom side of the scanning photolithography device for supporting the scanning-photolithography device;
    a precision working table, placed on an upper surface of the base plate for supporting a silicon wafer on which a pattern of an integrated circuit is to be lithographed; and
    an optical-head array, placed above the precision working table for photolithographic patterning of integrated circuits on the silicon wafer, the optical head array including a plurality of optical heads arranged in a matrix, having X and Y directions, wherein spaces in the X- or Y-direction of the matrix between adjacent optical heads are configured to be adjusted by means of a computer according to a size of the integrated circuit to be lithographed;
    wherein, each of said plurality of optical heads includes an optical-probe array, having a plurality of optical probes arranged a matrix;
    said optical-probe array includes a scan-imaging device, said scan-imaging device comprising a line-array photosource and a micro-imaging system;
    wherein the line-array photosource includes a plurality of adjacent, linearly arranged, short-wavelength micro-photosources, each micro-photosource having an on-off switch which can be controlled independently; and the micro-imaging system demagnifying the image of said line-array photosource;
    wherein, said micro-imaging system includes a lens imaging system, and in the lens imaging system, light provided by said line-array photosource successively passes through a convergent lens, a lens and a solid immersion lens, then forms a reduced real image on the silicon wafer conforming, in shape, to an image of the line-array photosource.

2. The device according to claim 1, wherein said-optical head array further comprises two calibrating-alignment optical-heads, said two calibrating-alignment optical-heads being respectively at a top end and a bottom end of the optical-head array.

3. A scanning photolithography device for scanning-photolithography of integrated circuits comprising:
    a base plate, being at a bottom side of the scanning photolithography device for supporting the scanning-photolithography device;
    a precision working table, placed on an upper surface of the base plate for supporting a silicon wafer on which a pattern of an integrated circuit is to be lithographed; and
    an optical-head array, placed above the precision working table for photolithographic patterning of integrated circuits on the silicon wafer, the optical head array including a plurality of optical heads arranged in a matrix, having X and Y directions, wherein spaces in the X- or Y-direction of the matrix between adjacent optical heads are configured to be adjusted according to the size of the integrated circuit to be lithographed by means of a computer;
    wherein, each of said plurality of optical heads includes an optical-probe array, having a plurality of optical probes arranged a matrix;
    wherein said optical-probe array includes a scan-imaging device, said scan-imaging device comprising a line-array photosource and a micro-imaging system; the line-array photosource including of a plurality of adjacent, linearly arranged, short-wavelength micro-photosources, each micro-photosource having an on-off switch which can be controlled independently; and the micro-imaging system demagnifying the image of said line-array photosource;
    wherein, said line-array photosource includes a line-array photosource device, and following elements successively arranged in a same line-array length thereof:
    n semiconductor lasers emitting light with even intensity, where n is a positive integer greater than or equal to 2;
    n convergent lenses respectively converging the emitted light of the lasers;

n optical fiber beams receiving the emitted light of the lens and each beam having m pieces of optical fiber where m is a positive integer greater than or equal to 2; and m line-array optical fiber heads, each of which having n pieces of optical fiber being straight-lined and respectively coming from one of the optical fiber beams, and imaging lenses, each of the imaging lenses corresponding to a respective one of the line-array optical fiber heads.

4. The device according to claim 3, wherein, said line array optical fiber head successively comprises:

an optical-fiber array layer, including a plurality of optical fibers, each of which comes from one of the optical fiber beams; an even light-intensity layer, including a mask and a coating on the line-array optical fiber head; and a phase-shift aperture layer where an area corresponding to the optical fiber appears as a square and presents high transmissivity to the laser having a wavelength, while other areas present high absorbance.

5. The device according to claim 3, wherein, said-optical head array further comprises two calibrating-alignment optical-heads, said two calibrating-alignment optical-heads being respectively at top end and the bottom ends of the optical-head array.

6. The device for scanning-photolithography of integrated circuits according to claim 4, wherein, said line-array photosource consists of a plurality of linearly arranged micro lasers, each micro laser having an on-off switch that can be controlled independently.

* * * * *